United States Patent
Sun et al.

(10) Patent No.: US 11,767,971 B2
(45) Date of Patent: Sep. 26, 2023

(54) LIGHT EMITTING ASSEMBLY AND LAMP

(71) Applicants: SUZHOU OPPLE LIGHTING CO., LTD., Suzhou (CN); OPPLE LIGHTING CO., LTD., Shanghai (CN)

(72) Inventors: Yinglong Sun, Suzhou (CN); Yu Mao, Suzhou (CN); Songjing Jiang, Suzhou (CN)

(73) Assignees: SUZHOU OPPLE LIGHTING CO., LTD., Suzhou (CN); OPPLE LIGHTING CO., LTD., Shanghai (CN)

( * ) Notice: Subject to any disclaimer, the term of this patent is extended or adjusted under 35 U.S.C. 154(b) by 0 days.

(21) Appl. No.: 17/854,164

(22) Filed: Jun. 30, 2022

(65) Prior Publication Data

US 2022/0333766 A1    Oct. 20, 2022

Related U.S. Application Data

(63) Continuation of application No. PCT/CN2020/140200, filed on Dec. 28, 2020.

(30) Foreign Application Priority Data

Dec. 31, 2019 (CN) .......................... 201911411157.2
Dec. 31, 2019 (CN) ......................... 201922493387.X

(51) Int. Cl.
  *F21V 23/00* (2015.01)
  *F21V 3/00* (2015.01)

(52) U.S. Cl.
  CPC .............. *F21V 23/001* (2013.01); *F21V 3/00* (2013.01)

(58) Field of Classification Search
  None
  See application file for complete search history.

(56) References Cited

U.S. PATENT DOCUMENTS

| 7,588,355 B1 * | 9/2009 | Liu .......................... F21V 15/01 |
| | | 362/240 |
| 9,279,578 B2 * | 3/2016 | Bertin ..................... F21S 8/032 |
| 2015/0348949 A1 | 12/2015 | Kobayakawa | |

FOREIGN PATENT DOCUMENTS

| CN | 201273472 Y | 7/2009 |
| CN | 207527422 U | 6/2018 |
| CN | 108644658 A | 10/2018 |
| CN | 108916667 A | 11/2018 |

(Continued)

OTHER PUBLICATIONS

International Search Report of PCT Application No. PCT/CN2020/140200 dated Mar. 25, 2021 with English translation, (5p).

*Primary Examiner* — Elmito Breval
(74) *Attorney, Agent, or Firm* — Arch & Lake LLP

(57) ABSTRACT

The present disclosure discloses a light emitting assembly and a lamp, the light emitting assembly includes a base portion, a conductive portion, a light source and a transparent insulating layer, the base portion is a rigid structure; the conductive portion is arranged on a surface of the base portion, and is insulated from the base portion; the light source is installed on the surface of the base portion where the conductive portion is located, and is electrically connected to the conductive portion; the transparent insulating layer covers the conductive portion and the light source.

19 Claims, 8 Drawing Sheets

(56) References Cited

FOREIGN PATENT DOCUMENTS

| CN | 208312039 U | 1/2019 |
| CN | 111043547 A | 4/2020 |
| CN | 211040676 U | 7/2020 |

\* cited by examiner

LIGHT EMITTING ASSEMBLY AND LAMP

CROSS-REFERENCE TO RELATED APPLICATIONS

This application is based upon and claims the priority of PCT patent application No. PCT/CN2020/140200 filed on Dec. 28, 2020 which claims priority to the Chinese patent application No. 201911411157.2 filed on Dec. 31, 2019, and the Chinese patent application No. 201922493387.X filed on Dec. 31, 2019, the entire contents of which are hereby incorporated by reference herein for all purposes.

TECHNICAL FIELD

The present disclosure relates to the technical field of lighting equipment, and in particular, to a light emitting assembly and a lamp.

BACKGROUND

Lamps are indispensable products in people's production and life. In the current installation process of the lamp, the light emitting assembly of the lamp need to be electrically connected by wires. The wires are usually installed in the housing of the lamp. During the assembly of the lamp, the process of connecting and hiding the wires is complicated, and there is a risk of breaking the wires, which will adversely affect the safety performance of the lamp.

SUMMARY

The present disclosure discloses a light emitting assembly.

The light emitting assembly may include: a base portion, which is a rigid structure; a conductive portion, which may be arranged on a surface of the base portion, and may be insulated from the base portion; a light source, which may be installed on the surface of the base portion where the conductive portion is located, and may be electrically connected to the conductive portion; and a transparent insulating layer, which may cover the conductive portion and the light source.

It is to be understood that both the foregoing general description and the following detailed description are exemplary and explanatory only and are not restrictive of the present disclosure.

BRIEF DESCRIPTION OF THE DRAWINGS

The drawings described here are used to provide further understanding of the present disclosure and constitute a part of the present disclosure. The examples of the present disclosure and the description thereof are used to explain the present disclosure, and do not constitute an improper limitation of the present disclosure. In the attached drawings.

DETAILED DESCRIPTION

Figure 1:
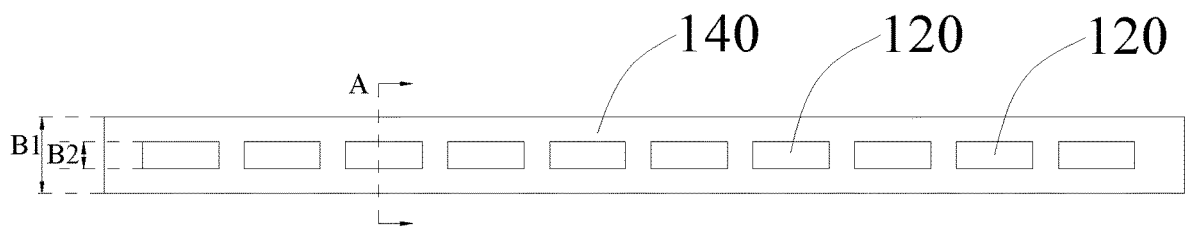
FIG. 1 is a structural diagram of a light emitting assembly disclosed in examples of the present disclosure.

In order to make the purposes, technical solutions, and advantages of the present disclosure clearer, the technical solutions of the present disclosure will be described clearly and completely below with reference to examples of the present disclosure and the corresponding drawings. Obviously, the described examples are only a part of examples of the present disclosure, rather than all examples of the present disclosure. Based on the examples of the present disclosure, all other examples obtained by those of ordinary skill in the art without creative work shall fall within the protection scope of the present disclosure.

Reference numerals provided in this disclosure may include:

100—light emitting assembly, 110—base portion, 111—through hole, 120—light source, 130—conductive portion, 140—transparent insulating layer,

200—power access portion, 210—limiting portion, 220—connecting portion, 230—installation portion, 240—ceiling portion, 250—wire, 260—functional portion, 270—fixing portion, 280—wire locker,

300—insulating component, 310—first insulating portion, 320—second insulating portion,

410—fixing component, 420—connecting component,

500—electrical connecting portion,

600—mounting base, 610—cover body, 620—base body, 621—limiting hole,

700—adapter plate, 710—connecting hole,

800—conductive pillar, 810—head portion, 820—rod portion,

900—bottom box, 910—matching hole, 911—extending region, 912—limiting region.

As shown in FIGS. 1 to 12, the examples of the present disclosure disclose a light emitting assembly 100 and a lamp. The light emitting assembly 100 includes a base portion 110, a conductive portion 130, a light source 120, and a transparent insulating layer 140, and the base portion 110 is a rigid structure. It should be noted that the rigid structure refers to that the base portion 110 is made of a rigid material, and in normal use, the base portion 110 hardly deforms. However, in the process of production and processing, due to the corresponding production requirements, the base portion 110 may also be deformed to a certain extent under set conditions with sufficient external force or high temperature adjustment, so that the base portion 110 may be made into a specific shape and structure according to design requirements and customer needs, and the base portion 110 is not unable to be deformed in an absolute sense.

The conductive portion 130 is disposed on a surface of the base portion 110, and the conductive portion 130 and the base portion 110 are insulated from each other, thereby ensuring that the lamp has a better safety performance. The light source 120 is installed on the surface of the base portion 110 where the conductive portion 130 is located, and the light source 120 is electrically connected to the conductive portion 130 to transmit electric energy to the light source 120 through the conductive portion 130. In order to prevent electricity leakage in the conductive portion 130 and the light source 120 during the operation of the lamp, the conductive portion 130 and the light source 120 are both covered with the transparent insulating layer 140.

The base portion 110 is formed of a rigid material, such as a polymer material, a composite material, a metal material, and the like. The shape and size of the base portion 110 may be determined according to actual conditions such as usage scenarios and customer needs. Optionally, the base portion 110 may be made of a metal material, on the one hand, it is easy to process and the cost is relatively low, on the other hand, the metal material component has a longer service life and a better appearance effect.

In order to further improve the structural strength of the base portion 110 and prevent the base portion 110 from being bent or deformed during the use of the lamp, optionally, the base portion 110 may be an aviation aluminum component, that is, the base portion 110 may be formed of an aviation aluminum material, so that the base portion 110 has a stronger structural strength, and the base portion 110 is basically not rusted after being used for a period of time, and the service life is relatively long. During the processing of the base portion 110, the base portion 110 may be made to have a smaller thickness to further reduce the installation space occupied by the lamp, and because the aviation aluminum material has a stronger tensile strength, the base portion 110 with a relatively small thickness can also have a strong structural strength, and it can basically ensure that the base portion 110 will not be deformed during the use of the lamp. In addition, in the case that the thickness of the base portion 110 is relatively small, the aesthetics of the lamp can be enhanced, and the comprehensive competitiveness of the product can be improved.

More specifically, the base portion 110 may be a strip structure, or the base portion 110 may also be a ring structure such as a circular structure, a rectangular structure, a polygonal structure, or the like. In the design and production process, the shape and size of the base portion 110 may be changed according to specific conditions such as usage scenarios and customer needs.

Since the metal material has the advantages of better conductivity, lower cost, and less difficulty in processing, the conductive portion 130 may also be made of a metal material. During the processing of the light emitting assembly 100, the conductive portion 130 may be formed in advance, and the conductive portion 130 and the base portion 110 are connected as a whole during the processing of the base portion 110. In the case that the conductive portion 130 is located on the surface of the base portion 110, the entire base portion 110 can have a stronger structural strength to ensure that the entire lamp has better structural stability. Furthermore, if the lamp fails, the location of the fault can be found quickly with the help of the conductive portion 130 on the surface of the base portion 110, which is convenient for maintenance. Of course, the conductive portion 130 fixed on the surface of the base portion 110 may be formed by other methods.

Optionally, the conductive portion 130 may be fixedly connected to the base portion 110 by the manner of pressing. A relatively large adhesion force can be formed between the conductive portion 130 and the base portion 110 under a certain pressure, and the weight and size of the conductive portion 130 is relatively small, so that the conductive portion 130 will not fall off the base portion 110. The size and the number of the conductive portion 130 may be determined according to actual conditions such as the rated current of the light source 120 and the number of the light source 120.

The light source 120 may be an LED lamp or other types of components with light emitting function. The size, rated voltage and other parameters of the light source 120 may be determined according to actual requirements, and are not limited here. The light source 120 is installed on the surface of the base portion 110 where the conductive portion 130 is located. Since the base portion 110 is a rigid structure, the base portion 110 can provide a stable installation foundation for the light source 120. The light source 120 may be installed on the surface of the base portion 110 in an embedded manner, and the light source 120 and the conductive portion 130 may be electrically connected during the assembling process of the light source 120.

Furthermore, the light source 120 may be a lamp bead. In order to further improve the lighting effect of the entire lamp, a plurality of the light source 120 may be provided. The brightness of the entire lamp and the illuminated area can be improved under the action of the plurality of the light source 120. In addition, the plurality of the light source 120 may be arranged on the base portion 110 at intervals, and the plurality of the light source 120 are all electrically connected to the conductive portion 130 to ensure that each light source 120 can work normally under the action of an external power source.

As described above, the base portion 110 may be a strip or ring structure. Accordingly, in the case that the shape of the base portion 110 is different, the arrangement form of the plurality of the light sources 120 may be determined according to the actual shape of the base portion 110. For example, in the case that the base portion 110 has a strip structure, the plurality of the light sources 120 may be arranged in a single column and multiple rows, or the plurality of the light sources 120 may be arranged in double columns and multiple rows, or the plurality of the light sources 120 may be arranged in multiple columns and multiple rows. Similarly, in the case that the base portion 110 has a ring structure, the plurality of the light sources 120 may be arranged in a ring shape, and the number of circles of the ring may be determined according to actual conditions.

The transparent insulating layer 140 may be a structure formed by curing a material such as a transparent insulating glue. During the processing of the light emitting assembly 100, the transparent insulating layer 140 may be formed outside the conductive portion 130 and the light source 120 by the manner of dipping, painting or spraying after the conductive portion 130 and the light source 120 are fixed on the base portion 110. The thickness of the transparent insulating layer 140 may be determined according to parameters such as operating current of the lamp. In addition, the thickness of the transparent insulating layer 140 may be made as small as possible under the condition that the lamp has a good safety performance, so as to minimize the hindrance and weakening effect of the transparent insulating layer 140 on the light emitted by the light source 120.

Optionally, the transparent insulating layer 140 may be made to filter light of a specific wavelength band according to actual requirements such as usage scenarios. For example, parameters such as the type and composition of the transparent insulating layer 140 may be changed so that the transparent insulating layer 140 can filter blue light with a wavelength of 400 nm-480 nm in the light emitted by the light source 120, so that even if the lamp disclosed in the examples of the present disclosure are used for a long time, it will not cause harm to human eyes. Alternatively, the material of the transparent insulating layer 140 may also be changed so that the transparent insulating layer 140 can have a certain diffusion effect on light.

More specifically, the transparent insulating layer 140 may be a glue layer formed by curing a UV (Ultraviolet Rays) glue. The UV glue has no volatiles, does not cause environmental pollution, has a fast curing speed, and has a low demand for curing conditions, which can improve the processing efficiency of the lamp. In addition, the low flammability of the UV glue can further improve the safety performance of the lamp. Moreover, the UV glue can be repeatedly applied and cured for many times, which is convenient for the production of the lamp and the maintenance of the lamp.

In the case that the above-mentioned light emitting assembly 100 is applied to a lamp, the conductive portion 130 may be electrically connected to the power access portion 200 to provide power to the light source 120. In the case that the base portion 110 is an insulating structure, even if the conductive portion 130 is charged during normal operation, the electricity will not be transmitted to the base portion 110, thereby ensuring that the base portion 110 has good insulation during the operation of the lamp. As mentioned above, the base portion 110 may also be made of a metal material, in the case that the base portion 110 is a metal structure, other insulating structures such as the transparent insulating layer 140 may be provided between the conductive portion 130 and the base portion 110, so as to ensure a good insulation performance between the base portion 110 and the conductive portion 130. In the case that the transparent insulating layer 140 is formed of a UV glue, and the transparent insulating layer 140 is provided between the base portion 110 and the conductive portion 130, the connection reliability between the conductive portion 130 and the base portion 110 can be further improved.

Figure 2:
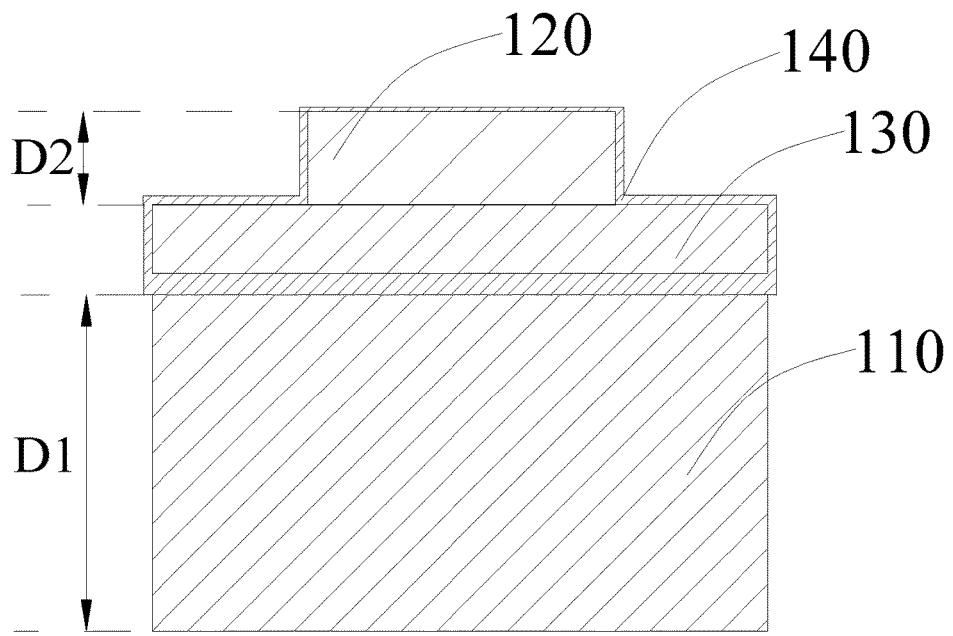
FIG. 2 is a cross-sectional diagram of a light emitting assembly disclosed in the examples of the present disclosure.
Figure 3:
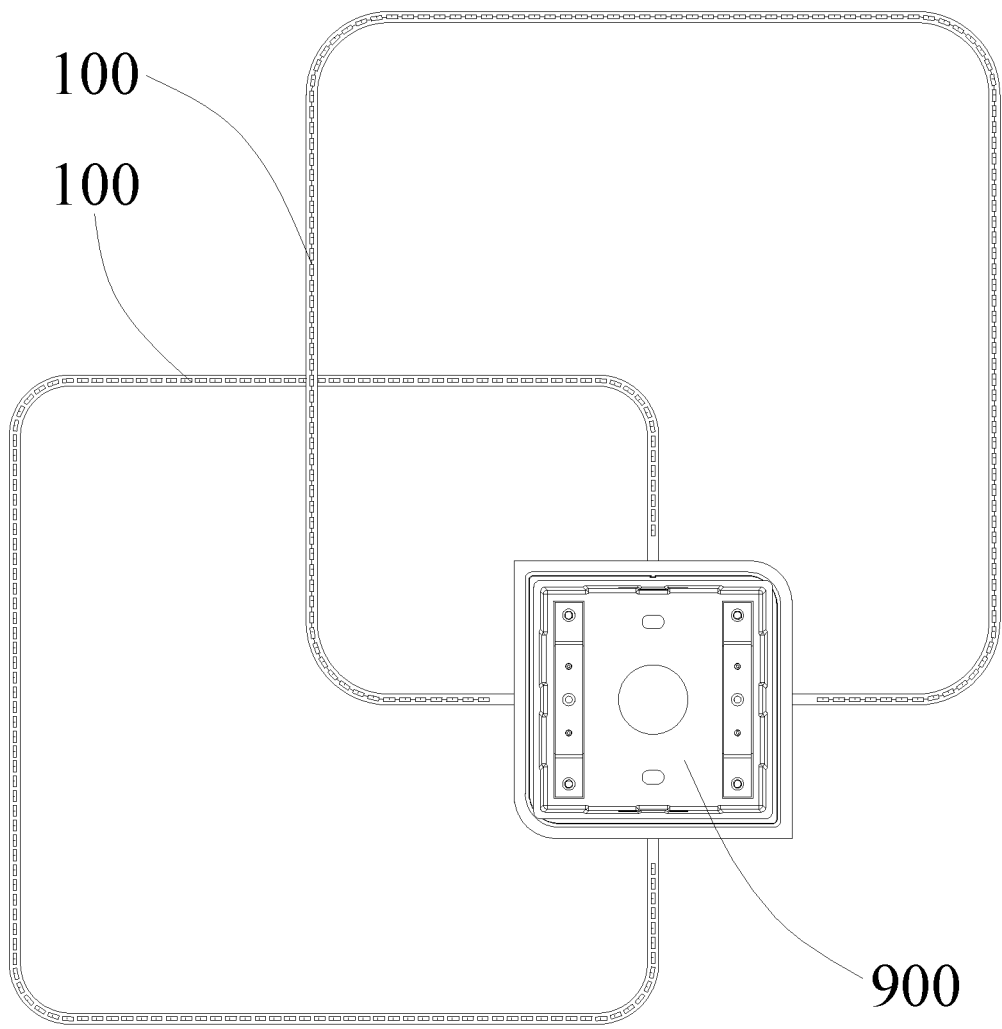
FIG. 3 is a structural diagram of a lamp disclosed in the examples of the present disclosure.
Figure 4:
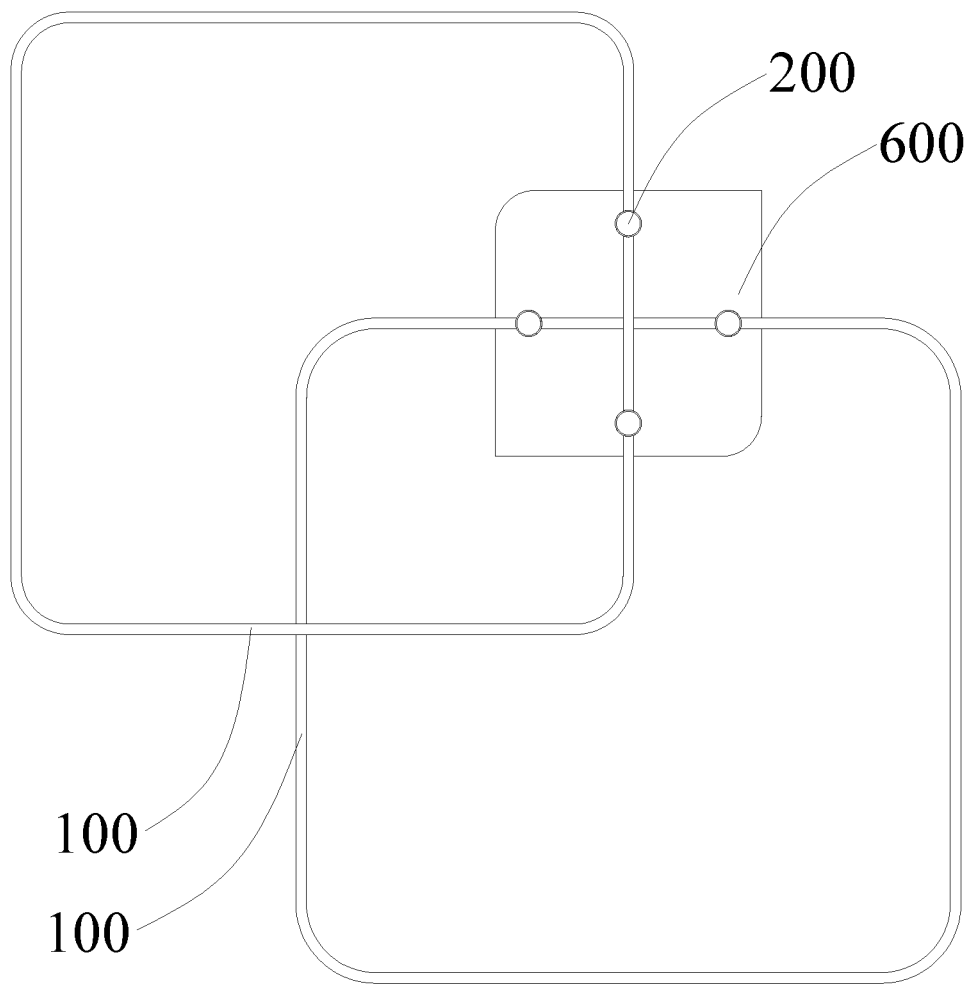
FIG. 4 is a structural diagram of a lamp in another direction disclosed in the examples of the present disclosure.
Figure 5:
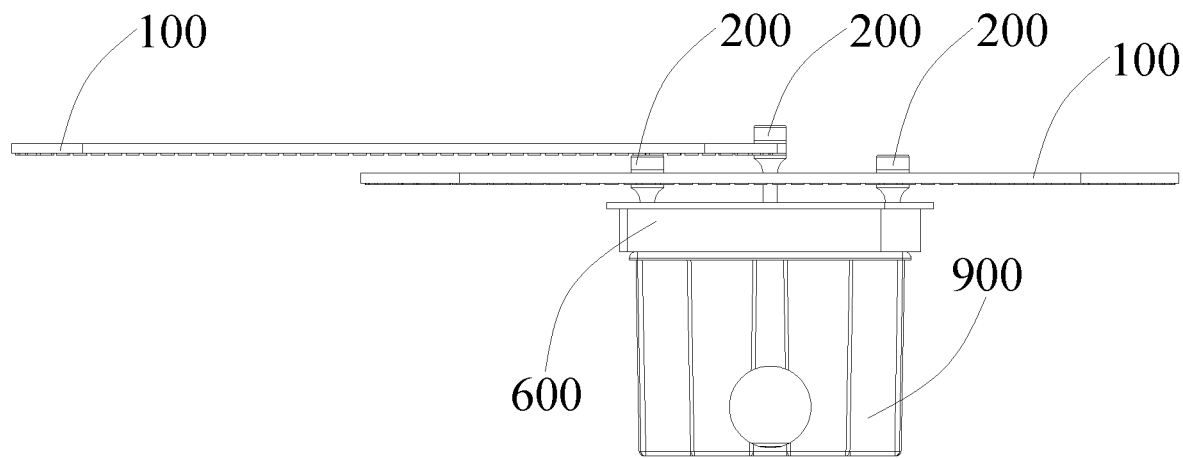
FIG. 5 is a structural diagram of a lamp in another direction disclosed in the examples of the present disclosure.
Figure 6:
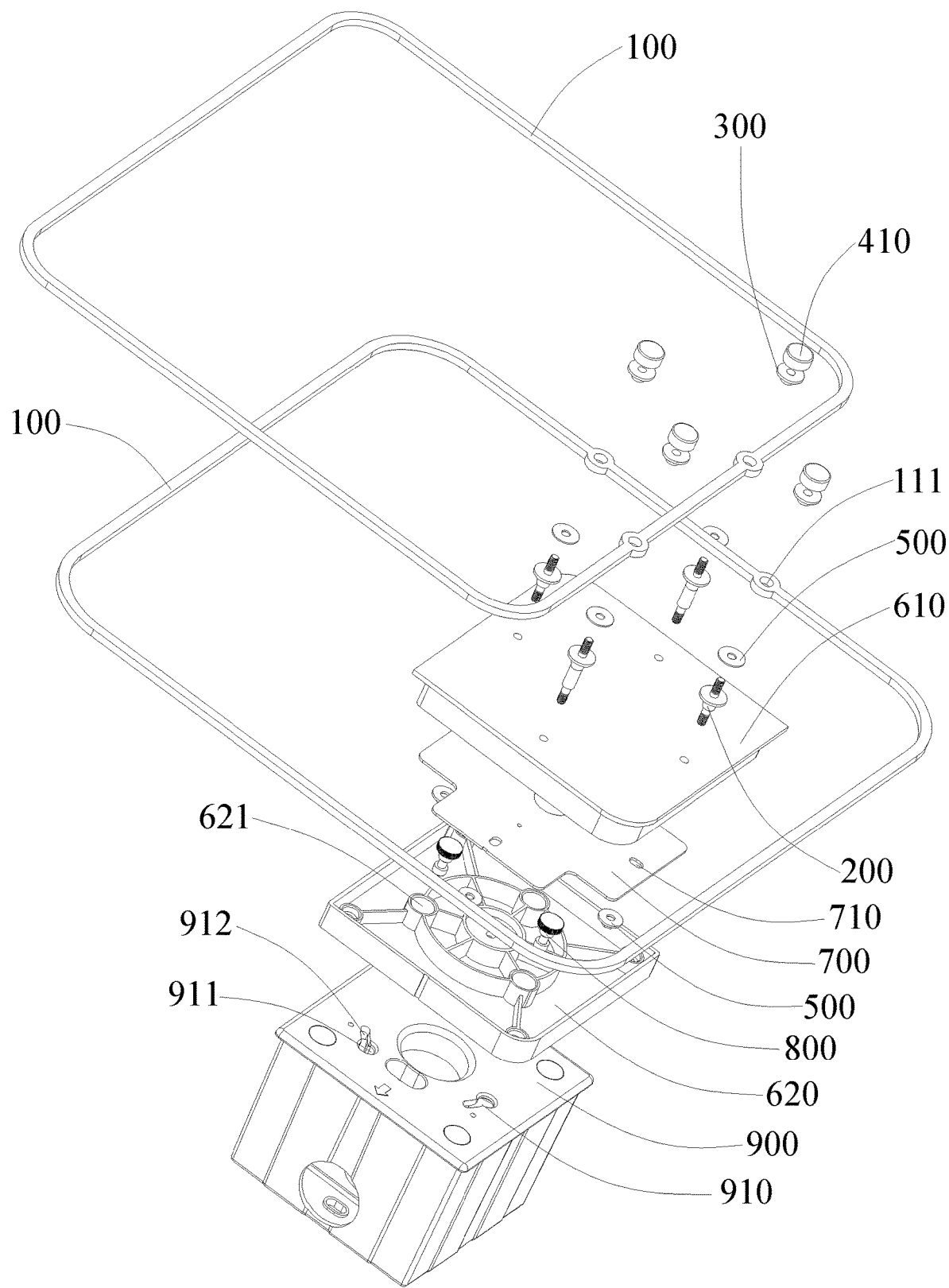
FIG. 6 is a decomposition diagram of a lamp disclosed in examples of the present disclosure.
Figure 7:
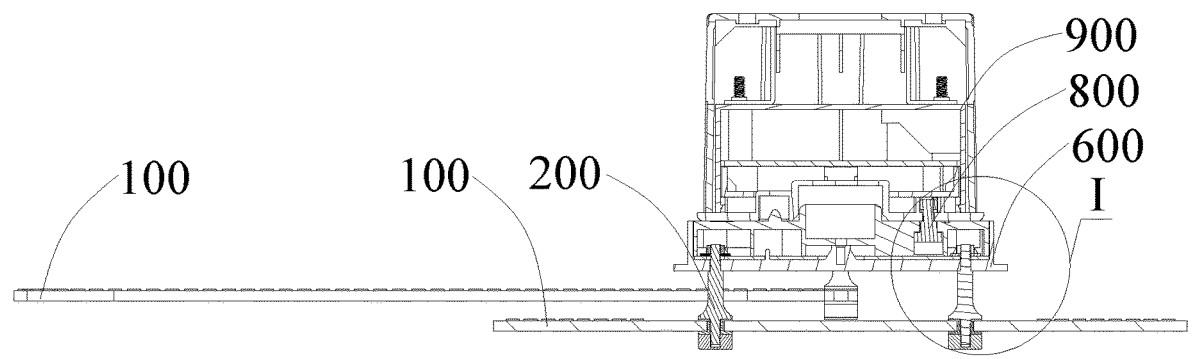
FIG. 7 is a cross-sectional diagram of a lamp disclosed in the examples of the present disclosure.
Figure 8:
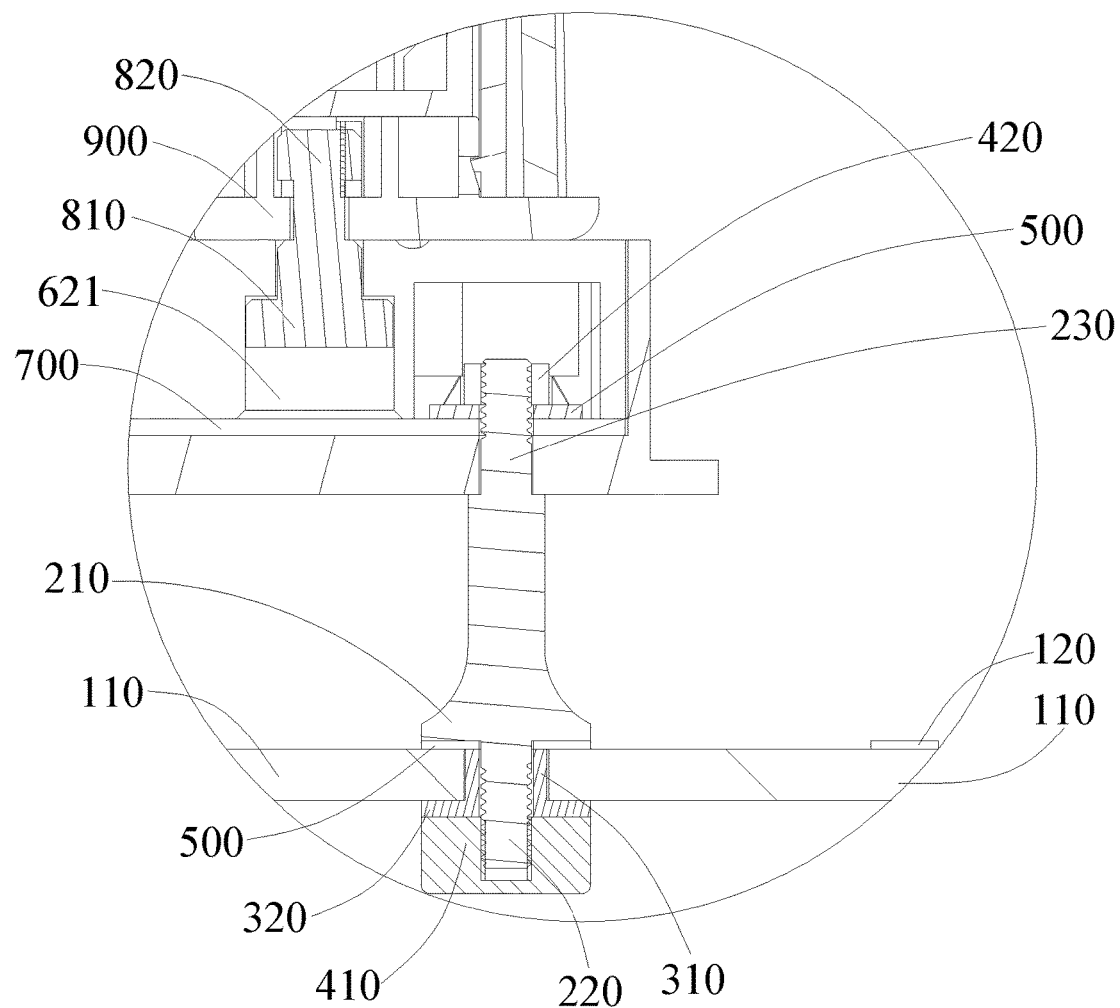
FIG. 8 is an enlarged view of the part I in FIG. 7.
Figure 9:
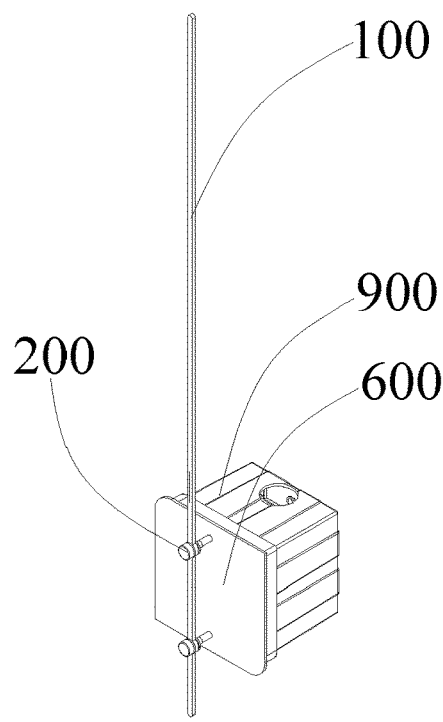
FIG. 9 is another structural diagram of a lamp disclosed in the examples of the present disclosure.

Furthermore, the light source 120 may have a sheet structure. As shown in FIG. 1 and FIG. 2, a size of the base portion 110 in a thickness direction of the base portion 110 may be D1, a size of the light source 120 in the thickness direction of the base portion 110 may be D2. In order to ensure that the light source 120 has a better installation firmness, D1 is larger than D2. In order to reduce the size of the entire light emitting assembly 100, the ratio of D1 to D2 may be 2~8, which can reduce the installation space occupied by the entire light emitting assembly 100, and can improve the appearance of the light emitting assembly 100 to a certain extent, and improve the overall performance of the product.

In addition, a size of the base portion 110 in a width direction of the base portion 110 may be B1, and a size of the light source 120 in the width direction of the base portion 110 may be B2, B2 is greater than B1, and the ratio of B1 to B2 may be 2~4, thereby further reducing installation space occupied by the light emitting assembly 100, and improving the appearance effect of the light emitting assembly 100.

In an example, in the case that the width B2 of the light source 120 is 1.4 mm and the thickness D2 of the light source 120 is 0.5 mm, the thickness D1 of the base portion 110 may be 3 mm, and the width B1 of the base portion 110 may be 4 mm.

As described above, the examples of the present disclosure further disclose a lamp. The lamp may be a ceiling lamp, a floor lamp, a wall lamp, etc. The lamp includes a power access portion 200 and the above-mentioned light emitting assembly 100. In addition, the light emitting assembly 100 may be fixedly installed on an installation foundation such as a wall or a roof using a fixed structure. For example, in the case where the power access portion 200 is a rigid structure, the light emitting assembly 100 may be fixedly installed directly through the power access portion 200.

Specifically, during the use of the lamp, the power access portion 200 may be connected to an external power source, that is, the power access portion 200 is connected to a power source provided externally. In addition, the light source 120 can work normally under the action of the external power source by electrically connecting the power access portion 200 and the conductive portion 130. Moreover, since the power access portion 200 is fixed on the base portion 110, in order to prevent the power access portion 200 from introducing electricity to the base portion 110, the power access portion 200 and the base portion 110 may be insulated from each other.

Since the base portion 110 and the power access portion 200 are both rigid structures, the entire light emitting assembly 100 may be directly supported on the power access portion 200. During the use of the lamp disclosed in the present disclosure, by connecting the power access portion 200 with an external power source, the lamp can form an electrical connection with the external power source, and the lamp can also form a relatively fixed relationship with the external power source, thereby simplifying installation steps and improving installation efficiency during the installation process of the lamp. In addition, the light source 120 of the lamp disclosed in the examples of the present disclosure forms an electrical connection with the external power source without the use of the wire 250, so that the situation of serious decline in the installation performance of the lamp due to the broken of the wire 250 will not occur during the use of the lamp.

For example, the external power source may be a socket installed on the wall, and the power access portion 200 may include two metal conductive plugs. In the case of normal use of the lamp, the power access portion 200 may be inserted into the socket, so that the power access portion 200 can form an electrical connection with the socket. In addition, since the power access portion 200 and the base portion 110 are both rigid structures, as the lamp is electrically connected to the socket, a reliable physical connection can be formed between the lamp and the socket under the support of the power access portion 200 and the base portion 110. Since the lamp disclosed in the examples of the present disclosure does not need to use supporting parts such as suspension wires, connecting rods or brackets during the installation and fixing process, the installation process of the lamp can be simplified.

Specifically, since the metal material have the ability to conduct electricity, and most of metal materials generally have relatively high hardness, and can meet the hardness and conductivity requirements of the power access portion 200, therefore, optionally, the power access part 200 is formed of a metal material. Of course, in the case where other rigid materials have relatively good conductive effects, other materials may also be used to form the power access portion 200. The power access portion 200 and the base portion 110 may form a relatively fixed relationship by a riveting, clamping or plugging manner. Alternatively, the power access portion 200 may be provided with an external thread, and the base portion 110 is provided with an internal threaded hole, and therefore the power access portion 200 and the base portion 110 can be connected through the manner of threaded connection. Since at least two power access portions 200 are provided, in the case that the at least two power access portions 200 are connected to the same base portion 110 through threaded connection, it can be ensured that the base portion 110 is stably supported on the power access portion 200. Furthermore, the power access portion 200 and the base portion 110 may also be relatively fixed by means of other connection structures.

In order to further improve the lighting effect of the lamp, at least two light emitting assemblies 100 may be provided, and the at least two light emitting assemblies 100 are both electrically connected to the power access portion 200. The lighting effect of the lamp can be more intuitively improved by adding the light emitting assembly 100. The shape of the base portion 110 in each light emitting assembly 100 may be the same or different, and the arrangement and relative positional relationship of the at least two light emitting assemblies 100 may be determined according to actual needs, so as to form lamps with different shapes to meet different usage scenarios or different customer needs.

In the case that at least two light emitting assemblies 100 are provided, the number of power access portions 200 is correspondingly increased. Optionally, the at least two light emitting assemblies 100 may be at least partially overlapped with each other. In this case, the irradiation areas of the at least two light emitting assemblies 100 can be overlapped and supplemented to a certain extent, and the lighting effect of the lamp can be further improved.

In addition, in the case that the base portion 110 of each light emitting assembly 100 is in a ring shape, the total installation space occupied by all the light emitting assemblies 100 can be made smaller by making the at least two light emitting assemblies 100 at least partially overlapped. In detail, the overlapping part of the plurality of the light emitting assemblies 100 may be used as the part that is connected to the power access portion 200. In the case that the parts of each light emitting assembly 100 connected to the power access portion 200 are overlapped, the interval between the plurality of the power access portions 200 can be made smaller, the overall structure of the lamp is more compact, and the installation space occupied is smaller.

Correspondingly, an insulating interval may be provided between the power access portion 200 and the base portion 110. For example, the power access portion 200 and the conductive portion 130 are fixed to each other, and the power access portion 200 is not directly contacted with the base portion 110, so that it can be ensured that the base portion 110 and the power access portion 200 are insulated from each other, or the power access portion 200 and the base portion 110 may also be insulated from each other with the help of an insulating structure.

As mentioned above, the power access portion 200 and the base portion 110 may be directly connected to form a relatively fixed relationship, or the power access portion 200 and the base portion 110 may also be indirectly connected by another connecting component 420 to form a relatively fixed relationship. Optionally, the lamp disclosed in the present disclosure may include a fixing component 410, a through hole 111 may be provided on the base portion 110, and the power access portion 200 may include a limiting portion 210 and a connecting portion 220, and the limiting portion 210 is connected to the connecting portion 220. In the process of assembling the power access portion 200 and the base portion 110, the limiting portion 210 and the fixing component 410 are respectively located on both sides of the base portion 110, the limiting portion 210 is located on the side where the conductive portion 130 is located, the limiting portion 210 is electrically connected to the conductive portion 130, the base portion 110 can be mounted on the connecting portion 220 by allowing the connecting portion 220 to pass through the through hole 111 to be fixed to the fixing component 410. In addition, by sandwiching the base portion 110 between the limiting portion 210 and the fixing component 410 in an axial direction of the through hole 111, it can be ensured that the base portion 110 and the connecting portion 220 form a more reliable fixed relationship, the lamp can have better structural stability, and this connection method is simple and convenient.

Optionally, the fixing component 410 and the connecting portion 220 may be detachably connected to form a fixed relationship, and the light emitting assemblies 100 can be freely replaced according to different customer needs by providing a variety of light emitting assemblies 100. Correspondingly, after the lamp has been used for a period of time, if the lighting emitting assembly 100 fails or is damaged, the lighting emitting assembly 100 can also be removed, and the lighting emitting assembly 100 can be repaired or replaced with a new one, which can reduce the requirements for maintenance and repair. For example, the fixing component 410 and the connecting portion 220 may be fixed to each other by a detachable connection such as a clamping connection, a plugging connection, a threaded connection, or the like.

Specifically, the connecting portion 220 and the limiting portion 210 may be formed by integral molding, which reduces processing difficulty and improves production efficiency on the one hand, and can also improve the reliability of the connection between the connecting portion 220 and the limiting portion 210 on the other hand, and ensure that the light emitting assembly 100 can be stably supported on the power access portion 200 and the power access portion 200 can transmit electric energy stably.

The through hole 111 may be formed by drilling. By making the through hole 111 and the limiting portion 210 different in shape and/or size, the limiting portion 210 and the through hole 111 can form a reliable matching relationship for position restriction. Optionally, the connecting portion 220, the limiting portion 210, and the through hole 111 may all have a circular structure, by making the diameter of the connecting portion 220 smaller than the diameter of the through hole 111, and making the diameter of the limiting portion 210 larger than the diameter of the through hole 111, the connecting portion 220 can pass through the through hole 111 and be fixed to the fixing component 410 on the other side of the through hole 111, and it can be ensured that the limiting portion 210 and the through hole 111 can form a matching relationship for position restriction, and then it can be ensured that the base portion 110 and the power access portion 200 can form a stable fixed relationship.

As mentioned above, the base portion 110 may be made of a metal material. In the case that the base portion 110 is formed of the metal material and the connecting portion 220 passes through the through hole 111, in order to further ensure that the base portion 110 and the connecting portion 220 can be insulated from each other, the diameter of the through hole 111 may be larger than the diameter of the connecting portion 220, so that the connecting portion 220 and the base portion 110 are insulated from each other. In addition, the limiting portion 210 may only be in contact with the conductive portion 130 on the surface of the base portion 110, but not in contact with the base portion 110, so as to ensure that the limiting portion 210 and the base portion 110 are insulated from each other. Furthermore, the fixing component 410 may be made of an insulating material, so that even if the fixing component 410 and the base portion 110 are in contact with each other, the base portion 110 will not be in a charged state during the operation of the lamp.

Alternatively, during the production and processing of the lamp, the base portion 110 with the through hole 111 may be formed in advance, and then an insulating layer can be formed on the outer surface of the base portion 110. For example, the insulating layer may be formed of an insulating glue, which can also ensure that the power access portion 200 passing through the through hole 111 of the base portion 110 and being fixed to the base portion 110 can form a reliable insulating relationship with the base portion 110. Moreover, after the insulating layer is formed on the outer surface of the base portion 110, the conductive portion 130 and the base portion 110 are fixed together to ensure that the conductive portion 130 can also form a reliable insulating relationship with the base portion 110.

Optionally, in order to reduce processing difficulty and improve production efficiency, the lamp disclosed in the examples of the present disclosure may further include an insulating component 300, the insulating component 300 may be sleeved outside the connecting portion 220, and at least a part of the insulating component 300 is sandwiched between the connecting portion 220 and the base portion 110. It can be ensured that the connecting portion 220 and the base portion 110 form a more reliable insulating relationship under the insulation effect of the insulating component 300. Compared with the previous example, the implementation process of this insulation method is relatively simple, and the insulation effect is more reliable.

Specifically, the insulating component 300 may be a cylindrical structure made of an insulating material such as rubber. During the assembly process of the lamp, the insulating component 300 is inserted into the through hole 111 of the base portion 110, and then the connecting portion 220 passes through the through hole of the insulating component 300 and is relatively fixed to the fixing component 410 on the other side of the base portion 110, so that a relatively reliable fixing relationship can be formed between the power access portion 200 and the base portion 110, and a good insulation reliability between the connecting portion 220 and the base portion 110 can be ensured.

As mentioned above, the fixing component 410 and the connecting portion 220 may be fixed to each other through the threaded connection, this connection method is simple and easy, and the fixing effect is relatively good. In order to further improve the fixing effect and reduce the processing difficulty, both the connecting portion 220 and the fixing component 410 may be made of metal materials. In this case, in order to ensure that the base portion 110 can still form a better insulation effect with the power access portion 200, the insulating component 300 may include a first insulating portion 310 and a second insulating portion 320, and the first insulating portion 310 is connected to the second insulating portion 320, the first insulating portion 310 is sandwiched between the connecting portion 220 and the base portion 110, and the second insulating portion 320 is sandwiched between the fixing component 410 and the base portion 110.

In the case that the insulating component 300 adopts the above structure, a good insulation effect between the connecting portion 220 and the base portion 110 can be ensured, and a good insulation effect between the fixing component 410 made of a metal material and connected to the power access portion 200 and the base portion 110 can be ensured, and this insulation method is simple and convenient, and the processing and assembly of the lamp are less difficult. Moreover, in the case that the insulating component 300 is made of a rubber material, the degree to which the second insulating portion 320 is squeezed can be adjusted to achieve the purpose of improving the fixing effect between the base portion 110 and the power access portion 200. In addition, the second insulating portion 320 can also provide a protective effect for the base portion 110 to prevent the base portion 110 from being damaged in the case that the fixing component 410 and the connecting portion 220 are tightly connected.

Specifically, the first insulating portion 310 and the second insulating portion 320 may be formed by integral injection molding, and the outer diameter of the first insulating portion 310 may be adapted to the inner diameter of the through hole 111, so as to ensure that the first insulating portion 310 can extend into the through hole 111, the inner diameter of the first insulating portion 310 and the inner diameter of the second insulating portion 320 are adapted to the outer diameter of the connecting portion 220. The outer diameter of the second insulating portion 320 may be slightly larger than the outer circumferential size of the fixing component 410, so that the second insulating portion 320 can provide more reliable insulating effect and protective effect for the fixing component 410 and the base portion 110.

As described above, the conductive portion 130 is disposed on the surface of the base portion 110, the limiting portion 210 is located on the side of the base portion 110 where the conductive portion 130 is located, and the limiting portion 210 is electrically connected to the conductive portion 130. In the assembly process of the lamp, by connecting the fixing component 410 with the connecting portion 220, and making the base portion 110 be limited between the limiting portion 210 and the fixing component 410, and under the locking action of the fixing component 410, the limiting portion 210 can form an electrical connection with the conductive portion 130 by directly contacting the conductive portion 130 on the surface of the base portion 110. In order to improve the reliability of the electrical connection between the conductive portion 130 and the limiting portion 210, optionally, the lamp disclosed in the examples of the present disclosure may further include an electrical connecting portion 500, the electrical connecting portion 500 is disposed between the conductive portion 130 and the limiting portion 210, and the limiting portion 210 is electrically connected to the conductive portion 130 through the electrical connecting portion 500.

In the case of adding the electrical connecting portion 500, it is obvious that the reliability of the electrical connection relationship between the conductive portion 130 and the limiting portion 210 can be improved, and the threshold values of parameters such as current and voltage can be increased to a certain extent, so that the application range of the lamp can be wider. Specifically, the electrical connecting portion 500 may have a sheet structure, and the electrical connecting portion 500 may be made of a metal material with excellent conductivity and low cost, such as metallic copper or metallic aluminum. In order to further improve the overall structural stability of the lamp, a through hole may be provided in the center of the electrical connecting part 500. During the assembly process of the lamp, the connection portion 220 may pass through the through hole of the electrical connecting portion 500 to install the electrical connecting portion 500 on the power access portion 200, and to ensure that the electrical connecting portion 500 forms relatively reliable electrical connection with both the limiting portion 210 and the conductive portion 130.

Figure 10:
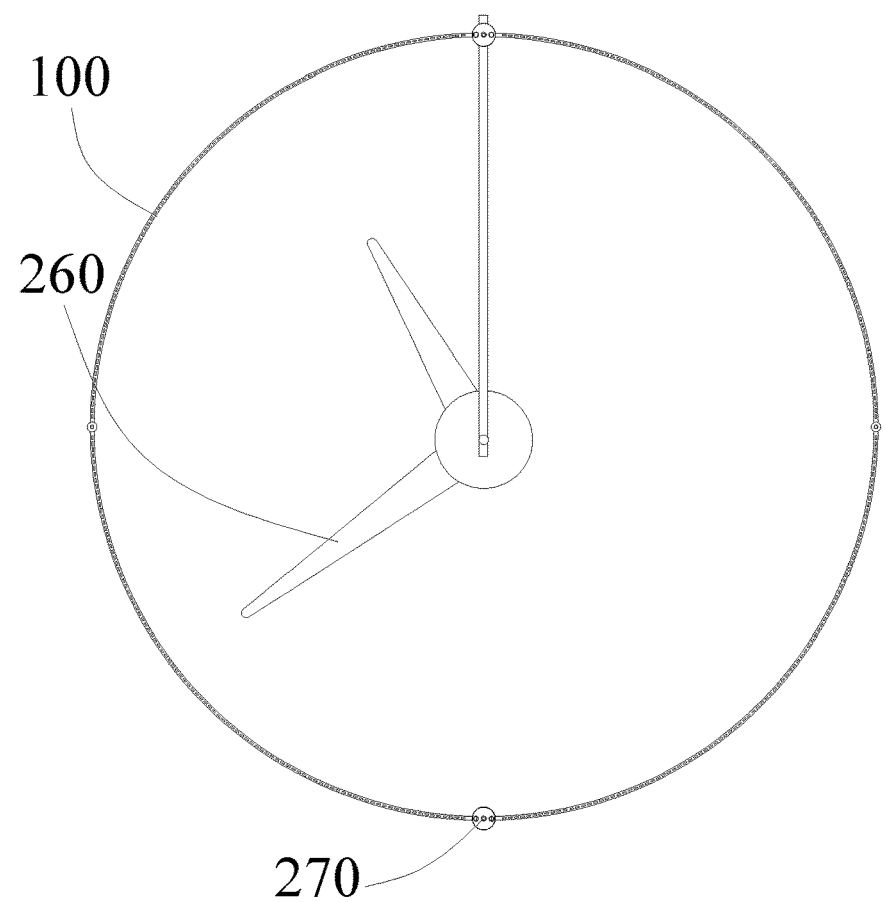
FIG. 10 is further another structural diagram of a lamp disclosed in the examples of the present disclosure.
Figure 11:
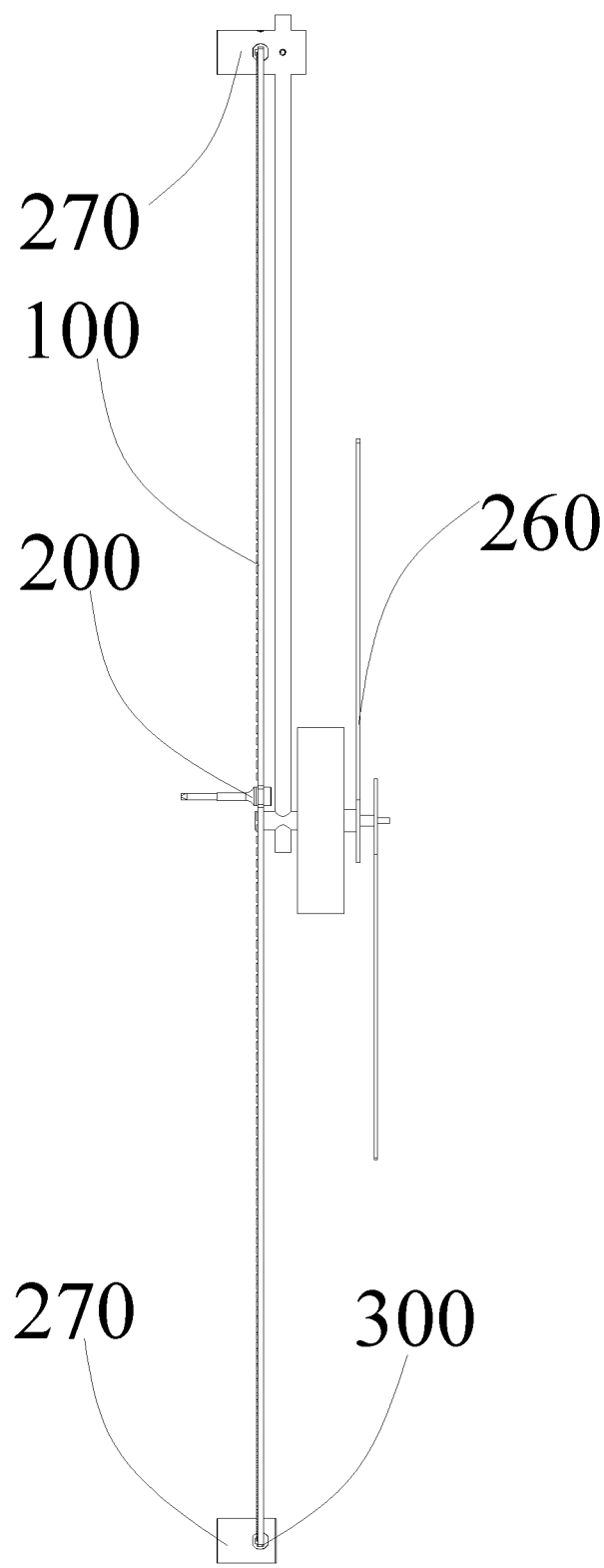
FIG. 11 is a schematic diagram of the structure shown in FIG. 10 in another direction.

In the case that the power access portion 200 includes the limiting portion 210, the connecting portion 220, and the installation portion 230, the power access portion 200 may also include other structures such as a fixing portion 270, and the light emitting assembly 100 may be connected to the fixing portion 270 to further improve the fixing effect of the light emitting assembly 100. As shown in FIG. 10 and FIG. 11, the light emitting assembly 100 may also be installed on the fixing portion 270, the fixing portion 270 may be fixed on the installation foundation, and the fixing portion 270 may specifically be a connecting component 420 such as a screw.

Figure 12:
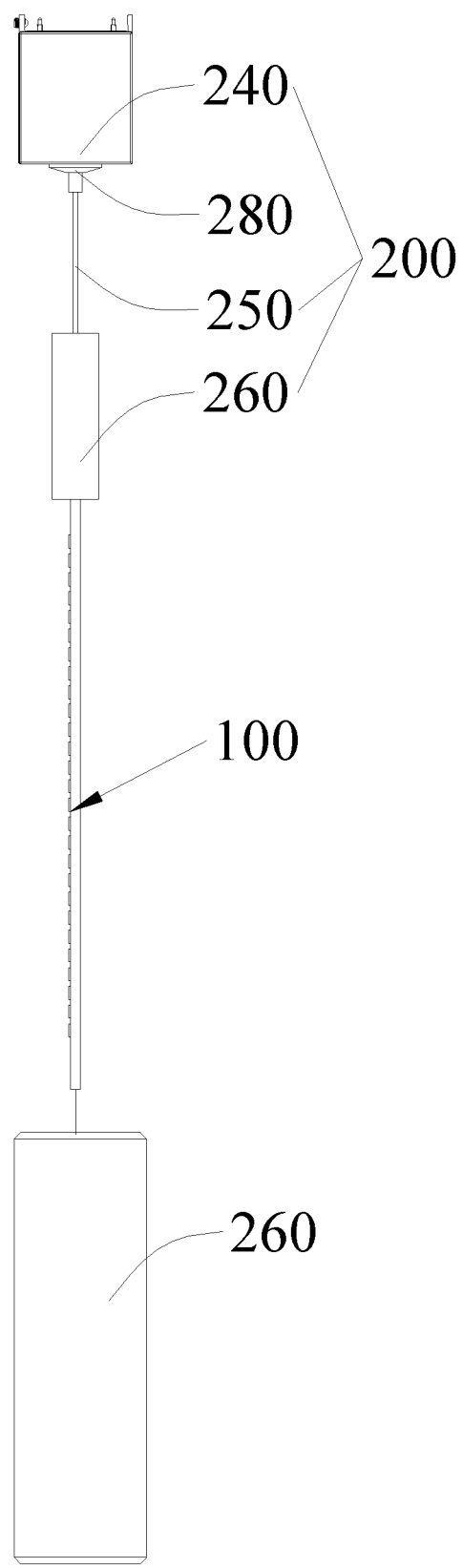
FIG. 12 is another structural diagram of a lamp disclosed in the examples of the present disclosure.

Alternatively, as shown in FIG. 12, the power access portion 200 may also have other structures. In detail, the power access portion 200 may include a ceiling portion 240, a wire locker 280 and a wire 250. During the installation of the lamp, the ceiling portion 240 may be installed on the installation foundation, and the conductive portion 130 may be electrically connected to an external power source through the wire 250, so as to achieve the purpose of power distribution for the light source 120. The wire locker 280 may be arranged between the ceiling portion 240 and the wire 250. The wire locker 280 is fixed on the ceiling portion 240 to limit the extended length of the wire 250. The wire 250 may extend into the ceiling portion 240 and be connected to an external power source.

Specifically, the ceiling portion 240 may be fixed on the installation foundation such as a roof by using an expansion screw or other components, or the ceiling portion 240 may also be fixed on the installation foundation by a magnetic suction method. Optionally, a functional portion 260 may be provided between the wire 250 and the light emitting assembly 100. The function of the functional portion 260 may be determined according to actual needs. For example, the functional portion 260 may be a fixing component 410 to improve the reliability of the connection between the wire 250 and the light emitting assembly 100. Alternatively, the functional portion 260 may be a decorative component covering the connection point between the wire 250 and the light emitting assembly 100, to improve the appearance of the lamp. In addition, in the case that the base portion 110 of the light emitting assembly 100 has a circular structure, the functional portion 260 may also be a clock device or other devices, to diversify the function of the lamp and improve the overall performance of the lamp.

Furthermore, the lamp disclosed in the examples of the present disclosure may further include a mounting base 600, the power access portion 200 may be mounted on the mounting base 600, in this case, the mounting base 600 may be used as the installation foundation of the power access portion 200. In the process of using the lamp, the mounting base 600 may also be used as a user's operating medium, and the entire lamp can be connected to an external power source such as a socket by grasping the mounting base 600. Specifically, the shape of the mounting base 600 may be determined according to actual conditions, for example, the mounting base 600 may have a circular, square, diamond, or polygonal structure. The mounting base 600 and the power access potion 200 may be formed in an integrated manner to fix the power access potion 200 on the mounting base 600.

Optionally, in the lamp disclosed in the examples of the present disclosure, the light source 120 may be arranged on the surface of the base portion 110 facing the mounting base 600. In this case, when the lamp is installed on an installation foundation such as a wall, the light source 120 can emit light towards the wall, and the wall can provide a certain diffusion effect for the light emitted by the light source 120 of the lamp, and can prevent the dazzling and glare caused by the light of the lamp directly reaching human eyes.

Furthermore, the lamp disclosed in the examples of the present disclosure may further include an adapter plate 700, the adapter plate 700 may be connected to an external power source, that is, the adapter plate 700 is connected to a power source provided externally. In the case that the adapter plate 700 is provided, the mounting base 600 may be provided with a mounting cavity, and the adapter plate 700 may be installed in the mounting cavity, and an end of the power access portion 200 away from the base portion 110 may be fixed on the adapter plate 700 and electrically connected to the adapter plate 700, so that under the action of the adapter plate 700, the electric energy of the external power source is transmitted to the light source 120 from the power connecting portion 200 and the conductive portion 130. Specifically, the type of the adapter plate 700 may be determined according to actual needs. For example, a transformer or other components may be installed on the adapter plate 700 to convert the voltage of the commercial power. In this case, the rated voltage of the lamp is relatively small, and the safety performance is relatively good.

Moreover, as described above, the lamp disclosed in the examples of the present disclosure may include a plurality of light emitting assemblies 100. In the case that at least two light emitting assemblies 100 are provided, the number of the power access portions 200 is at least four. It is relatively complicated for four power access portions 200 to be connected to the commercial power at the same time. Therefore, the at least four power access portions 200 may be installed on the adapter plate 700 at the same time, and the at least four power access portions 200 are also electrically connected to the adapter plate 700. In this case, the adapter plate 700 of the external power source may be used as the power supply component of the at least four power access portions 200, which reduces the difficulty of assembling the lamp and prevents the situation that wire winding process and wire hiding process are difficult to implement due to the use of the wire 250.

Further, a connecting hole 710 may be provided on the adapter plate 700, a connecting component 420 is provided on a side of the adapter plate 700 away from the base portion 110, and the power access portion 200 includes a limiting portion 210 and an installation portion 230, the installation portion 230 passes through the connecting hole 710 and is fixed to the connecting component 420. The adapter plate 700 is sandwiched between the limiting portion 210 and the connecting component 420 in the axial direction of the connecting hole 710.

By adopting the above structure, the adapter plate 700 and the power access portion 200 can form a reliable fixed connection relationship, and the installation portion 230 and the connecting component 420 can be detachably connected. In this case, the difficulty of assembling the adapter plate 700 and the power access portion 200 is relatively low, and it is easy to repair and replace components. By making the size of the limiting portion 210 larger than the size of the connecting hole 710, it can be ensured that the limiting portion 210 and the adapter plate 700 are mutually limited. More specifically, the installation portion 230 and the connecting component 420 may be connected to each other in a threaded connection manner.

Optionally, the component that provides conductive function on the adapter plate 700 may also be arranged on a surface of the adapter plate 700. In this case, the adapter plate 700 and the limiting portion 210 can form a reliable electrical connection relationship by allowing the limiting portion 210 to be in contact with the surface of the adapter plate 700. Optionally, an electrical connecting portion 500 may also be provided between the adapter plate 700 and the limiting portion 210, so that the adapter plate 700 and the limiting portion 210 form a more reliable electrical connection relationship through the electrical connecting portion 500. The electrical connecting portion 500 may be a sheet structure, and a through hole 111 may be provided in the center of the electrical connecting portion 500, and the electrical connecting portion 500 is threaded on the installation portion 230, so as to be sandwiched between the limiting portion 210 and the connecting component 420 together with the adapter plate.

During the installation process of the lamp, the lamp may be directly installed on the bottom box 900. In this case, there is no need to separately provide a socket for the lamp. In this case, the adapter plate 700 may be connected to the commercial power. Optionally, the lamp disclosed in the examples of the present disclosure may further include a conductive pillar 800, the conductive pillar 800 includes a head portion 810 and a rod portion 820. The mounting base 600 may be provided with a limiting hole 621. During the process of installing the lamp on the bottom box 900, the rod portion 820 may pass through the limiting hole 621 and be fixedly connected with the bottom box 900. At the same time, head portion 810 is matched with the limiting hole 621 for position restriction in a direction in which the rod portion 820 extends into the limiting hole 621, and the head portion 810 is electrically connected to the adapter plate. With the conductive pillar 800 of the above structure, the adapter plate 700 can form a fixed connection with the bottom box 900, and the electrical energy in the bottom box 900 can be introduced into the lamp by the conductive pillar 800.

Specifically, the size of the head portion 810 of the conductive pillar may be larger than the size of the rod portion 820 of the conductive pillar, so as to ensure that the rod portion 820 can pass through the limiting hole 621, and the head portion 810 may be matched with the limiting hole 621 for position restriction to prevent the mounting base 600 from loosening or prevent the mounting base 600 from falling off the bottom box 900. The mounting base 600 may include a cover body 610 and a base body 620, the limiting hole 621 may be provided on the base body 620, the cover body 610 and the base body 620 may be connected to each other by means of clamping or buckling, and the cover body 610 and the base body 620 enclose a mounting cavity. In order to ensure that the power access portion 200 can be connected to the adapter plate 700 in the mounting cavity, the cover body 610 may be provided with a through hole, so that the installation portion 230 can extend into the through hole and be connected to the adapter plate 700.

Further, the lamp disclosed in the examples of the present disclosure may further include a bottom box 900, so there is no need to separately purchase the bottom box 900 for the lamp during the installation of the lamp by the user, and prevents the situation that the separately purchased bottom box 900 and the mounting base does not match with each other. The bottom box 900 is provided with a matching hole 910. The matching hole 910 includes an extending region 911 and a limiting region 912, the extending region 911 and the limiting region 912 are connected. During the assembly of the lamp, by allowing the rod portion 820 to extend from the extension region 911 into the bottom box 900, and allowing the rod portion 820 to move towards the limiting region 912, when the rod portion 820 moves to the limiting region 912, the rod portion 820 can be restricted from being separated from the bottom box 900 by cooperating with the limiting region 912, it is ensured that the mounting base 600 and the bottom box 900 are fixed as a whole, and the entire lamp assembly is completed. Of course, in the actual installation process, the bottom box 900 may usually be installed on a wall or other installation location first, and then the bottom box 900 and the installation portion 230 are connected together by the conductive portion 130, and the wire 250 embedded in the bottom box 900 is connected with the conductive pillar 800 to complete the power distribution work of the lamp.

Specifically, a limiting structure may also be provided on the rod portion 820, and the size of the extending region 911 is larger than the size of the limiting region 912, thereby ensuring that the rod portion 820 can form a relatively fixed relationship with the bottom box 900. In addition, the bottom box 900 may further include a box body and a box cover, and the matching hole 910 may be provided on the box cover. The bottom box 900 may be a general-purpose bottom box 900, or bottom boxes 900 with various sizes may be designed according to market demand.

The present disclosure discloses a light emitting assembly and a lamp, to solve the problem that the light emitting assembly of the current lamp needs to conduct electricity with the help of wires, the wire connecting process and wire hiding process are complicated, and the safety hazard of the lamp is increased once a wire is broken.

In order to solve the above problem, the present disclosure adopts the following technical solutions.

A light emitting assembly is provided, the light emitting assembly comprises:
  a base portion, which is a rigid structure;
  a conductive portion, which is arranged on a surface of the base portion, and is insulated from the base portion;
  a light source, which is installed on the surface of the base portion where the conductive portion is located, and is electrically connected to the conductive portion; and
  a transparent insulating layer, which covers the conductive portion and the light source.

A lamp is provided, the lamp comprises a power access portion and the above light emitting assembly, the power access portion is a rigid structure, and the power access portion is relatively fixed to the base portion, and the power access portion is insulated from the base portion, the power access portion is configured to be connected to an external power source, and the power access portion is electrically connected to the conductive portion.

The technical solutions adopted by the present disclosure can achieve the following advantages.

In the light emitting assembly disclosed in the present disclosure, the base portion is a rigid structure, the conductive portion is arranged on a surface of the base portion, and the conductive portion is connected to the light source, so that during the installation process of the lamp using the above-mentioned light emitting assembly, the power distribution work of the lamp can be completed by directly connecting the conductive portion of the light emitting assembly to an external power source without the process of connecting and hiding the wires. Moreover, the conductive portion and the base portion are insulated from each other, and both the conductive portion and the light source are covered with a transparent insulating layer, which can ensure that the light emitting assembly has a good safety performance. In addition, the problem of reducing the structural strength of the base portion due to the installation of other structures or hollow settings in the base portion can be prevented by positioning the conductive portion on the surface of the base portion. Besides, in the case that the conductive portion is located on the surface of the base portion, it is convenient for the maintenance and repair operation of the light emitting assembly.

The above examples of the present disclosure focus on the differences between the various examples. As long as the different optimization features in the various examples are not contradictory, they can be combined to form a more example. Considering the simplicity of the text, it is not repeated here.

The foregoing descriptions are merely examples of the present disclosure, and are not intended to limit the present disclosure. For those skilled in the art, the present disclosure can have various modifications and changes. Any modification, equivalent replacement, improvement, etc. made within the spirit and principle of the present disclosure should be included in the scope of the present disclosure.

What is claimed is:

1. A light emitting assembly, comprising:
a base portion, which is a rigid structure;
a conductive portion, which is arranged on a surface of the base portion, and is insulated from the base portion;
a light source, which is installed on the surface of the base portion where the conductive portion is located, and is electrically connected to the conductive portion; and
a transparent insulating layer, which covers the conductive portion and the light source,
wherein the light source is a sheet structure, a size of the base portion in a thickness direction of the base portion is D1, a size of the light source in the thickness direction of the base portion is D2, D1 is greater than D2, and a ratio of D1 to D2 is 2~8;
or a size of the base portion in a width direction of the base portion is B1, a size of the light source in the width direction of the base portion is B2, B2 is greater than B1, and a ratio of B1 to B2 is 2~4.

2. The light emitting assembly according to claim 1, wherein the base portion is an aviation aluminum component.

3. The light emitting assembly according to claim 1, wherein the transparent insulating layer is a UV glue layer.

4. The light emitting assembly according to claim 1, wherein a plurality of the light sources are provided, the plurality of the light sources are arranged on the base portion at intervals, and the plurality of the light sources are all electrically connected to the conductive portion.

5. The light emitting assembly according to claim 1, wherein the base portion is a strip or ring structure.

6. A lamp, comprising:
a power access portion; and
a light emitting assembly, wherein the light emitting assembly comprises:
a base portion, which is a rigid structure;
a conductive portion, which is arranged on a surface of the base portion, and is insulated from the base portion;
a light source, which is installed on the surface of the base portion where the conductive portion is located, and is electrically connected to the conductive portion;
a conductive pillar, wherein the conductive pillar comprises a head portion and a rod portion; and
a transparent insulating layer, which covers the conductive portion and the light source; and
wherein the power access portion is a rigid structure, and the power access portion is relatively fixed to the base portion, and the power access portion is insulated from the base portion, the power access portion is configured to be connected to an external power source, and the power access portion is electrically connected to the conductive portion.

7. The lamp according to claim 6, further comprising a fixing component, wherein the base portion is provided with a through hole, the power access portion comprises a limiting portion and a connecting portion, the limiting portion is connected to the connecting portion, the limiting portion and the fixing component are respectively located on both sides of the base portion, and the limiting portion is located on a side where the conductive portion is located, the limiting portion is electrically connected to the conductive portion, and the connecting portion passes through the through hole, and is fixed with the fixing component, the base portion is sandwiched between the limiting portion and the fixing component in an axial direction of the through hole.

8. The lamp according to claim 7, further comprising an insulating component, wherein the insulating component is sleeved outside the connecting portion, and at least a part of the insulating component is sandwiched between the connecting portion and the base portion.

9. The lamp according to claim 8, wherein the insulating component comprises a first insulating portion and a second insulating portion, the first insulating portion is connected to the second insulating portion, the first insulating portion is sandwiched between the connecting portion and the base portion, and the second insulating portion is sandwiched between the fixing component and the base portion.

10. The lamp according to claim 7, further comprising an electrical connecting portion, wherein the electrical connecting portion is between the conductive portion and the limiting portion, and the limiting portion is electrically connected to the conductive portion through the electrical connecting portion.

11. The lamp according to claim 6, further comprising a mounting base, wherein the power access portion is mounted on the mounting base.

12. The lamp according to claim 11, further comprising an adapter plate, wherein the adapter plate is configured to be connected to an external power source, the mounting base is provided with a mounting cavity, the adapter plate is installed in the mounting cavity, and an end of the power access portion away from the base portion is fixed to the adapter plate, and is electrically connected to the adapter plate.

13. The lamp according to claim 12, wherein the adapter plate is provided with a connecting hole, a connecting component is provided on a side of the adapter plate away from the base portion, and the power access portion comprises a limiting portion and an installation portion, the installation portion passes through the connecting hole and is fixed to the connecting component, the adapter plate is sandwiched between the limiting portion and the connecting component in an axial direction of the connecting hole.

14. The lamp according to claim 13, wherein an electrical connecting portion is provided between the adapter plate and the limiting portion, and the limiting portion is electrically connected to the adapter plate through the electrical connecting portion.

15. The lamp according to claim 12, wherein the mounting base is configured to be installed on a bottom box, the mounting base is provided with a limiting hole, the rod portion passes through the limiting hole and is configured to be fixedly connected to the bottom box, the head portion is matched with the limiting hole for position restriction in a direction in which the rod portion extends into the limiting hole, and the head portion is electrically connected to the adapter plate.

16. The lamp according to claim 15, further comprising the bottom box, wherein the bottom box is provided with a matching hole, the matching hole comprises an extending region and a limiting region, the extending region communicates with the limiting region, the rod portion extends from the extending region into the bottom box, and the limiting region cooperates with the rod portion to restrict the rod portion from separating from the bottom box.

17. The lamp according to claim 11, wherein the light source is located on a side surface of the base portion facing the mounting base.

18. The lamp according to claim 6, wherein at least two light emitting assemblies are provided, and each light emitting assembly is electrically connected to the power access portion.

19. The lamp according to claim 18, wherein the at least two light emitting assemblies are at least partially overlapped with each other.

* * * * *